(12) United States Patent
Jain et al.

(10) Patent No.: US 10,014,692 B2
(45) Date of Patent: Jul. 3, 2018

(54) APPARATUSES, METHODS, AND SYSTEMS WITH CROSS-COUPLING NOISE REDUCTION

(71) Applicant: Intel Corporation, Santa Clara, CA (US)

(72) Inventors: Amit K. Jain, Portland, OR (US); Sameer Shekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 674 days.

(21) Appl. No.: 14/575,900

(22) Filed: Dec. 18, 2014

(65) Prior Publication Data

US 2016/0181812 A1 Jun. 23, 2016

(51) Int. Cl.
| | | |
|---|---|---|
| H01F 5/00 | (2006.01) | |
| H03H 7/00 | (2006.01) | |
| H02J 4/00 | (2006.01) | |
| H03H 7/48 | (2006.01) | |
| H03H 7/09 | (2006.01) | |

(52) U.S. Cl.
CPC .................. *H02J 4/00* (2013.01); *H01F 5/00* (2013.01); *H03H 7/00* (2013.01); *H03H 7/09* (2013.01); *H03H 7/48* (2013.01)

(58) Field of Classification Search
CPC .................................... H01F 5/00; H03H 7/00
USPC ....................................................... 307/11, 30
See application file for complete search history.

(56) References Cited

U.S. PATENT DOCUMENTS

| | | | | |
|---|---|---|---|---|
| 6,339,265 B1* | 1/2002 | Levin | ........................ | H02J 3/01 |
| | | | | 307/105 |
| 6,465,832 B1* | 10/2002 | Maeda | ................ | H01L 23/5223 |
| | | | | 257/307 |
| 6,636,027 B1* | 10/2003 | Nerone | ............. | H05B 33/0809 |
| | | | | 323/364 |
| 7,362,192 B1 | 4/2008 | Lin et al. | | |
| 8,212,416 B2* | 7/2012 | Navid | ..................... | H01F 17/04 |
| | | | | 307/105 |
| 2003/0021096 A1* | 1/2003 | Vinson | .................... | H01L 23/50 |
| | | | | 361/782 |

(Continued)

FOREIGN PATENT DOCUMENTS

JP    20122253561 A    12/2012

OTHER PUBLICATIONS

International Search Report and Written Opinion dated Feb. 22, 2016 for International Patent Application No. PCT/US2015/060875, 14 pages.

*Primary Examiner* — Adi Amrany
(74) *Attorney, Agent, or Firm* — Schwabe, Williamson & Wyatt, P.C.

(57) ABSTRACT

Embodiments include apparatuses, methods, and systems with cross-coupling noise reduction in circuits. In embodiments, a circuit may include a common inductor and a negatively coupled inductor pair connected or coupled between the first inductor and a first load and a second load. The negatively coupled inductor pair may include a first and a second inductor. The first inductor may be connected or coupled to the first load and the second inductor may be connected or coupled to the second load to reduce cross-coupling noise between the first load and the second load. Examples of passive structures that may be used to implement the circuit are also described. Other embodiments may also be described and claimed.

10 Claims, 9 Drawing Sheets

100

(56) References Cited

U.S. PATENT DOCUMENTS

| | | | |
|---|---|---|---|
| 2004/0167730 A1* | 8/2004 | Yamada | G01R 21/1331 |
| | | | 702/60 |
| 2007/0052511 A1 | 3/2007 | Loke et al. | |
| 2009/0316333 A1* | 12/2009 | Imanaka | C23C 24/04 |
| | | | 361/311 |
| 2010/0207695 A1 | 8/2010 | Bao | |
| 2010/0259100 A1 | 10/2010 | Hamstra et al. | |
| 2016/0005544 A1* | 1/2016 | Jakoubovitch | H01G 4/32 |
| | | | 361/301.3 |
| 2016/0182001 A1* | 6/2016 | Zeng | H03H 1/0007 |
| | | | 336/105 |

\* cited by examiner

APPARATUSES, METHODS, AND SYSTEMS WITH CROSS-COUPLING NOISE REDUCTION

FIELD

Embodiments of the present invention relate generally to the technical field of electronic circuits, and more particularly to reducing cross-coupling noise in circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Frequently, a single power supply provides current for more than one load. Voltage noise at any load may occur, however, due to cross-coupling noise from one or more other coupled or connected loads. Various methods may be used to reduce cross-coupling noise. Unfortunately, most of the current solutions result in significant additional cost and/or use of valuable area on a device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
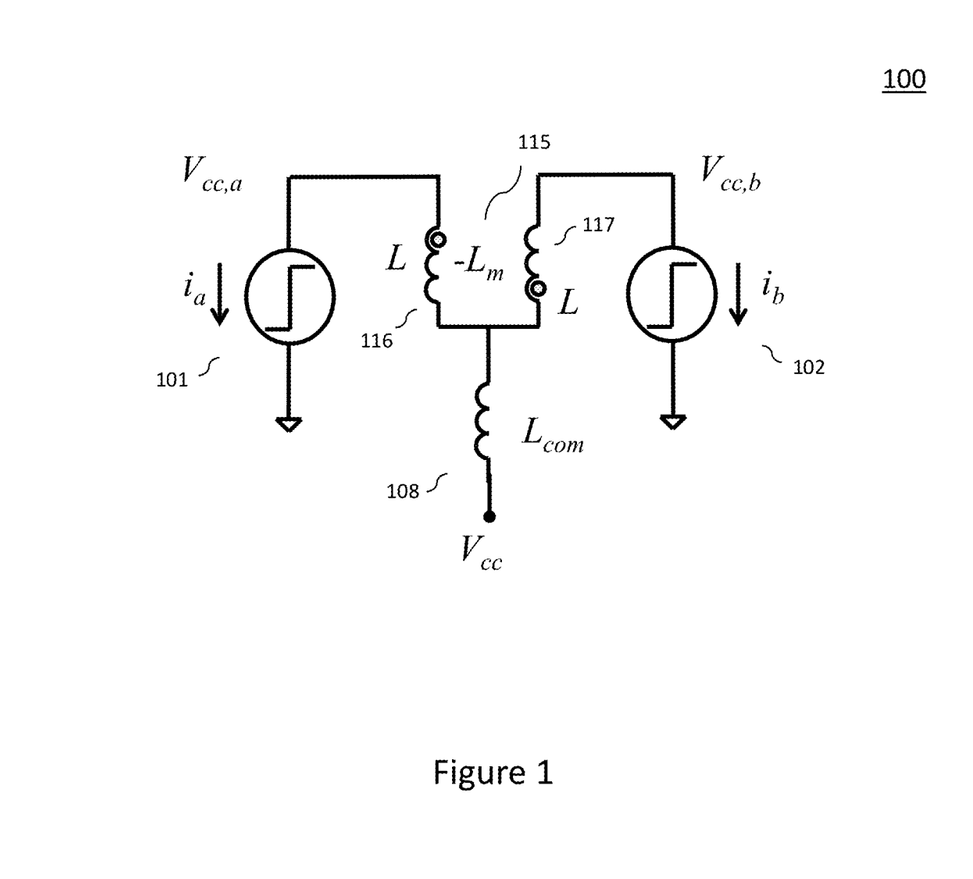
FIG. 1 illustrates an example circuit associated with reducing cross-coupled noise in accordance with various embodiments.

FIG. 1 illustrates an example circuit 100 associated with reducing cross-coupled noise in accordance with various embodiments. In circuit 100, it may be undesirable for current changes at Load A 101 to induce significant voltage noise at Load B 102, and vice-versa. In the embodiment shown, circuit 100 may include an inductor 108 having a common path inductance value $L_{com}$, coupled between a single power supply $V_{cc}$ and a negatively coupled inductor pair 115 including a first inductor 116 and second inductor 117, having an inductance value L. In the embodiment, first inductor 116 and second inductor 117 may have a negative mutual inductance value of $-L_m$ between them. In the embodiment, first inductor 116 may be coupled or connected to Load A 101 while second inductor 117 may be coupled or connected to Load B 102 to reduce a cross-coupling noise between Load A 101 and Load B 102 by counteracting a voltage change across inductor 108.

In embodiments, negatively coupled inductor pair 115 may reduce a cross-coupling noise between Load A 101 and Load B 102 in response to a current change in Load A 101 or Load B 102. An explanation follows below for the embodiments, ignoring resistances and capacitances for simplicity. Note that DC voltage of power supply $V_{cc}$ may be indicated by $V_{dc}$ while $\frac{di_a}{dt}$, and $\frac{di_b}{dt}$ indicates changes in current $i_a$ or $i_b$ over time, t. Accordingly, voltage at Load A 101, $v_{cc,a}$, may be given by:

$$v_{cc,a} = V_{dc} - L\frac{di_a}{dt} + L_m\frac{di_b}{dt} - L_{com}\frac{d(i_a+i_b)}{dt} \quad (1)$$
$$= V_{dc} - (L+L_{com})\frac{di_a}{dt} + (L_m - L_{com})\frac{di_b}{dt}$$

Accordingly, voltage $v_{cc,b}$ at Load B 102, may be given by:

$$v_{cc,b} = V_{dc} + (L_m - L_{com})\frac{di_a}{dt} - (L+L_{com})\frac{di_b}{dt} \quad (2)$$

Thus, in an embodiment, if an event at Load B 102 causes a change in current at Load B 102 while current remains constant at Load A, "$i_a$ constant," voltage at Load A 101 and Load B 102 may be given by:

$$v_{cc,a} = V_{dc} + (L_m - L_{com})\frac{di_b}{dt}; \quad (3)$$

$$v_{cc,b} = V_{dc} - (L+L_{com})\frac{di_b}{dt} \quad (4)$$

A noise portion of above equation (3) may be represented by $$(L_m - L_{com})\frac{di_b}{dt}.$$

Thus, from equation (3), it can be seen that mutual inductance value $L_m$ may be counteracting voltage noise or cross-coupling noise induced by a common path inductance value $L_{com}$. In embodiments, if $L_m = L_{com}$, then $v_{cc,a} = V_{dc}$. Thus, a cross-coupling noise may be substantially canceled, i.e., Load A 101 may not experience any voltage noise due to negative coupling effects. Furthermore, in embodiments, a self-noise on Load B 102 can be reduced by reducing inductance value L without substantially increasing cross-coupling noise. In embodiments, if common part inductance value $L_{com}$, of inductor 108 is designed to approximately equal mutual inductance value $L_m$ of negatively coupled inductor pair 115, a cross-coupling noise between Load A 101 and Load B 202 may be substantially canceled.

In embodiments, if inductance value L is designed to substantially equal mutual inductance value $L_m$ (a coupling factor of 1), and a substantially equal and simultaneous di/dt (positive or negative) event occurs at Load A 101 and Load B 102, voltage at Load A and Load B may be given by:

Accordingly, in the embodiment, voltage noise at Load A 101 and Load B 102 may be determined by substantially a function of the common path inductance value $L_{com}$. Thus, for the embodiment, voltage noise may be reduced further than in a circuit using only isolated inductors without any coupling between them.

$$v_{cc,a} = V_{dc} - L_{com}\frac{d(i_a+i_b)}{dt}; \quad v_{cc,b} = V_{dc} - L_{com}\frac{d(i_a+i_b)}{dt} \quad (5)$$

Finally, if $L = L_m$, in an embodiment where a current change or "

$$\frac{di}{dt}$$

event" occurs on Load A 101 and Load B 102 that is substantially equal and simultaneous but with opposite polarity:

$$v_{cc,a} = V_{dc} - (L+L_m)\frac{di_a}{dt}; \quad v_{cc,b} = V_{dc} + (L+L_m)\frac{di_a}{dt} \quad (6)$$

Accordingly, in the embodiment, common path inductance value $L_{com}$ may not contribute to voltage noise. Furthermore, for the embodiment, inductance value L (and therefore mutual inductance value $L_m$) can be reduced as indicated above.

Figure 2:
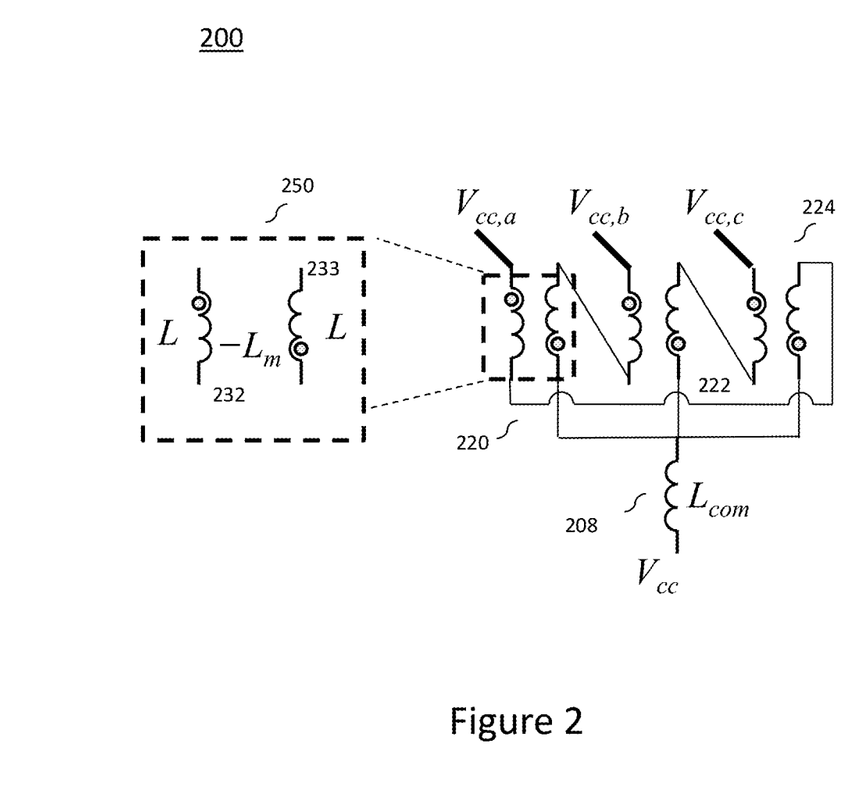
FIGS. 2 and 3 illustrate example circuits in accordance with various embodiments.
Figure 3:
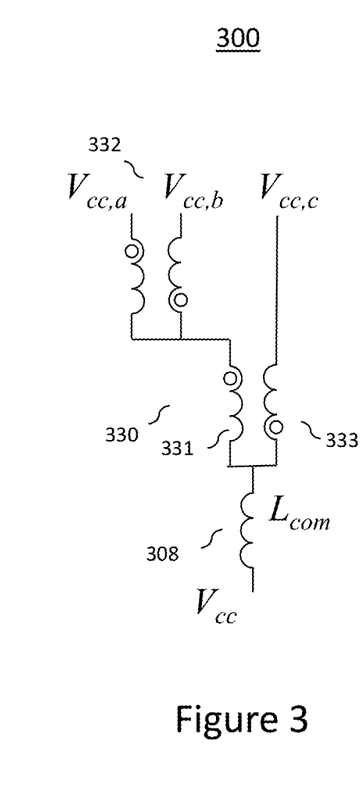

FIGS. 2 and 3 illustrate examples for reducing cross-coupled noise for circuits coupled or connected to more than two loads in accordance with various embodiments. In FIG. 2, circuit 200 may be coupled to three loads, Loads A, B, and C which may receive current provided by a single power supply $V_{cc}$. As shown, circuit 200 may include a first negatively coupled inductor pair 220, a second negatively coupled inductor pair 222, and a third negatively coupled inductor pair 224, coupled or connected on a first side to a common inductor or inductor 208 and on a second side to respective loads A, B, and C (not shown) to reduce a cross-coupling noise between Loads A, B, and C. Negatively coupled inductor pair 220 may include a first inductor 232 and a second inductor 233. As shown at 250, first inductor 232 and second inductor 233 each may have an inductance value of L and a mutual inductance value of $-L_m$ between them. As shown, in the embodiment, inductor 208 may be connected or coupled to power supply $V_{cc}$. In embodiments, each load has negative inductive coupling to the other (n−1) loads. Accordingly, in an embodiment, to reduce or mitigate cross-coupling noise, n*(n−1)/2 negatively coupled inductor pairs may be connected or coupled to a common inductor to reduce cross-coupling noise between n loads.

FIG. 3 illustrates an additional embodiment for a circuit coupled or connected to three loads. In embodiments, one or more of Load A, B, and/or C, may realize a similar reduction in cross-coupling noise with fewer negatively coupled inductor pairs as compared to circuit 200 of FIG. 2. In the embodiment shown, circuit 300 may include a common inductor 308 having an inductance value $L_{com}$ connected or coupled to a first negatively coupled inductor pair 330. In embodiments, negatively coupled inductor pair 330 may include a first inductor 331 and a second inductor 333. First inductor 331 may be coupled to a second negatively coupled inductor pair 332 connected or coupled to a Load A and a Load B (not shown). For the embodiment, second inductor 333 of first negatively coupled inductor pair 330 may be coupled to a third load, Load C (not shown).

Figure 4:
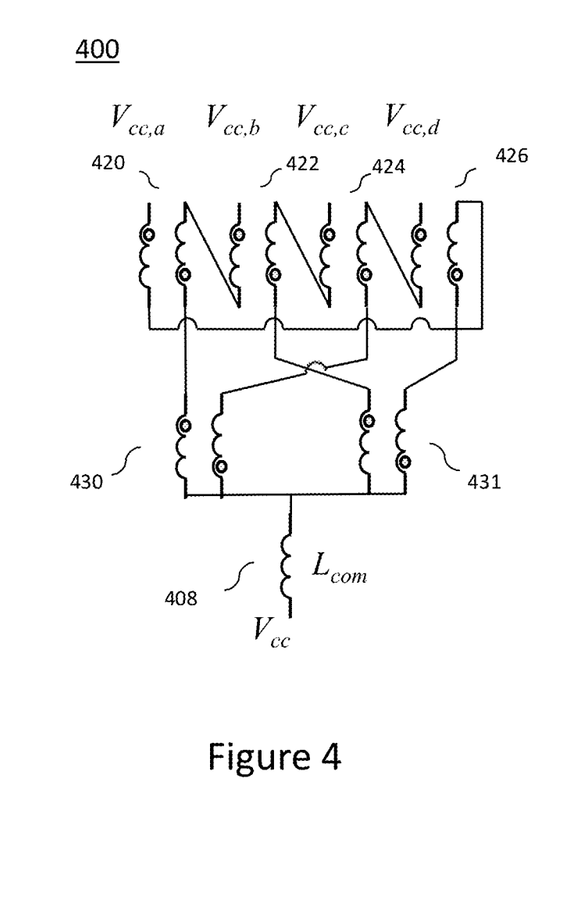
FIGS. 4 and 5 illustrate additional example circuits in accordance with various embodiments
Figure 5:
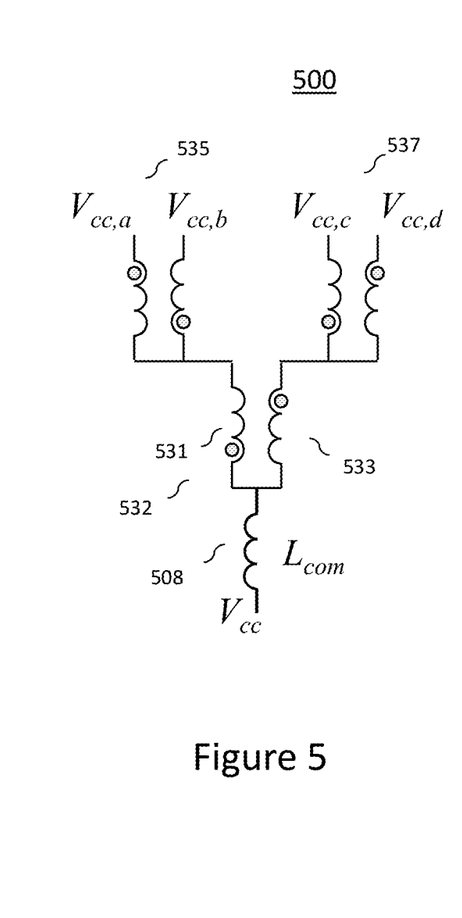

FIGS. 4 and 5 illustrate examples for reducing cross-coupled noise for circuits including four loads in accordance with various embodiments. In FIG. 4, circuit 400 may be coupled to four loads, Load A, Load B, Load C, and Load D (not shown) sharing a single power supply $V_{cc}$. As shown, circuit 400 may include a first negatively coupled inductor pair 420, a second negatively coupled inductor pair 422, a third negatively coupled inductor pair 424, and a fourth negatively coupled inductor pair 426, connected or coupled on a first side to respective loads A, B, C, and D and on a second side to a fourth and a fifth negatively coupled inductor pairs 430 and 431 to reduce a cross-coupling noise between Loads A, B, C, and D. In the embodiment, a common inductor 408 may be connected or coupled between negatively coupled inductor pairs 430 and 431 and power supply $V_{cc}$. Accordingly, applying the equation introduced above with respect to FIG. 1, for a circuit with four loads, n=4, thus, n*(n−1)/2=4*(4−1)/2=6. It follows that, in the embodiment, six negatively coupled inductor pairs may be coupled to common inductor 408 to reduce cross-coupling noise between four loads.

FIG. 5 illustrates an additional embodiment for a circuit including four loads. In embodiments, one or more of four loads, Loads A, B, C, and D (not shown) may in some cases realize a similar reduction in cross-coupling noise with fewer negatively coupled inductor pairs as compared to circuit 400 of FIG. 4. In the embodiment shown, circuit 500 may include a common inductor 508 having a common path inductance value of $L_{com}$ connected or coupled to a first negatively coupled inductor pair 532. In embodiments, negatively coupled inductor pair 532 may include a first inductor 531 and a second inductor 533. First inductor 531 may be connected or coupled to a second negatively coupled inductor pair 535 which may in turn be connected or coupled to Load A and Load B. In the embodiment, second inductor 533 may be connected or coupled to a second negatively coupled inductor pair 537 which may in turn be connected or coupled to a Load C and a Load D.

Figure 6:
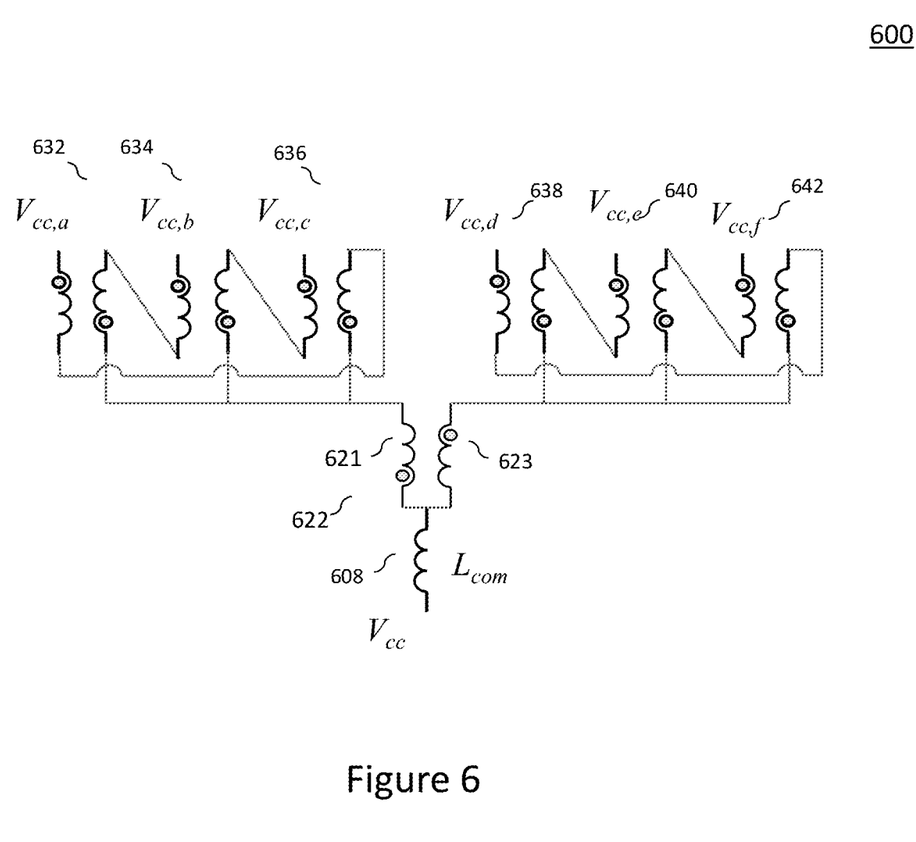
FIG. 6 illustrates another example circuit in accordance with various embodiments.

FIG. 6 illustrates example circuit 600 which may be connected or coupled to six loads. In the embodiment shown, a common inductor 608 having a common path inductance value of $L_{com}$ may be connected or coupled to a first negatively coupled inductor pair 622. In embodiments, first negatively coupled inductor pair 622 may be referred to as a first grouping or first plurality. In embodiments, negatively coupled inductor pair 622 includes a first inductor 621 and a second inductor 623. First inductor 621 may be connected or coupled to a second grouping or second plurality of negatively coupled inductor pairs 632, 634, and 636 which may in turn be connected or coupled to respective Loads A, B, and C. In the embodiment, second inductor 623 may be connected or coupled to a second plurality of negatively coupled inductor pairs 638, 640, and 642 which are in turn connected or coupled to respective Loads D, E, and F. Accordingly, in the embodiment shown, seven negatively coupled inductor pairs 632, 634, 636, 638, 640, and 642 may be connected or coupled to common inductor 608 to reduce a cross-coupling noise between six loads.

Figure 7:
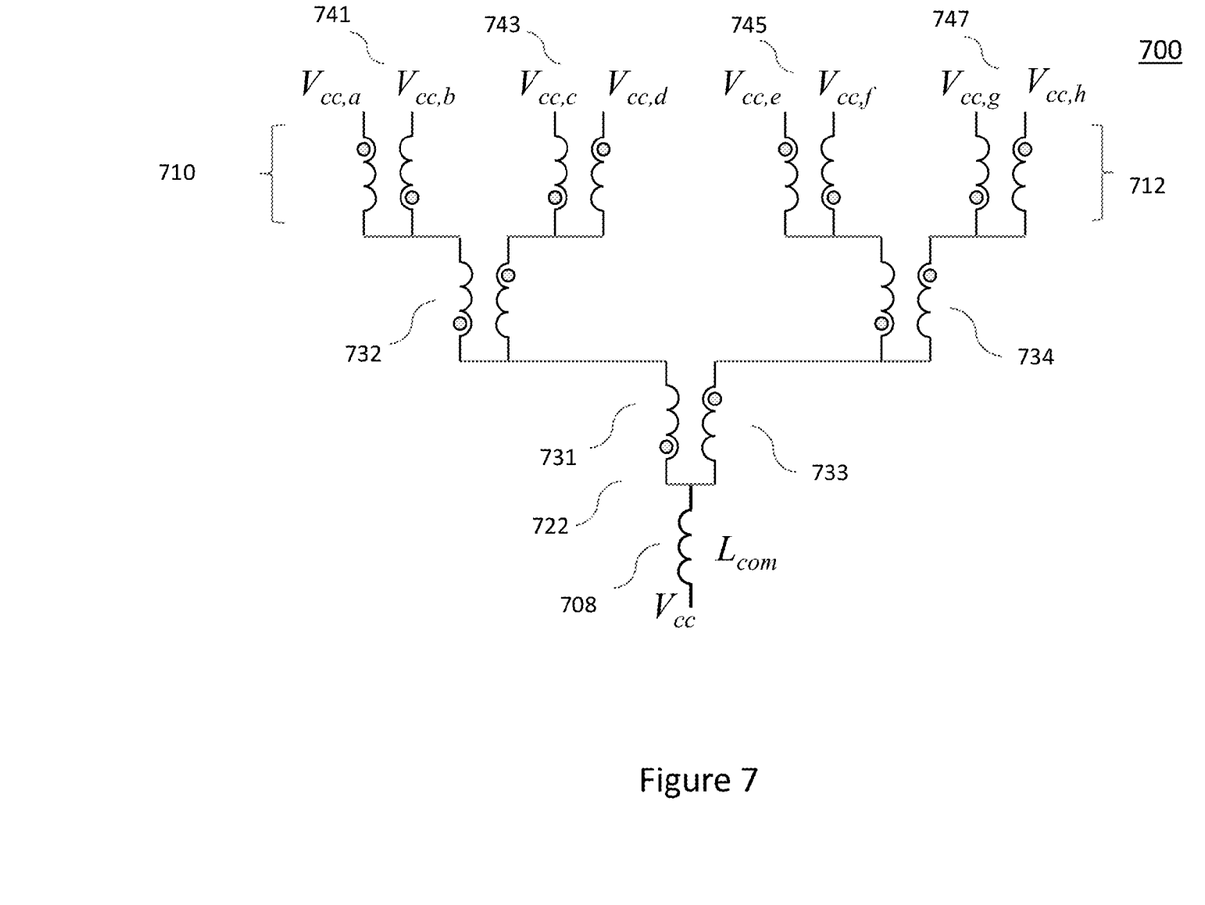
FIG. 7 illustrates another example circuit in accordance with various embodiments.

FIG. 7 illustrates an example circuit 700 for reducing cross-coupled noise in a circuit coupled to eight loads that may receive current from a power supply $V_{cc}$, in accordance with various embodiments. Starting from the top of FIG. 7, circuit 700 may include a first plurality of negatively coupled inductor pairs 710 including a first negatively coupled inductor pair 741 and a second negatively coupled inductor pair 743 and a second plurality of negatively coupled inductive pairs 712 including a third negatively coupled inductor pair 745 and a fourth negatively coupled inductor pair 747. In the embodiment, the first plurality of negatively coupled inductor pairs 710 and the second plurality of negatively coupled inductor pairs 712 may be connected or coupled on a first side to respective Loads A-D and E-H while on a second side to respective fifth and sixth negatively coupled inductor pairs 732 and 734. Fifth and sixth negatively coupled inductor pairs 732 and 734 may in turn be connected or coupled to a respective first inductor 731 and second inductor 733 of a seventh negatively coupled inductor pair 722. In the embodiment, seventh negatively coupled inductor pair 722 may be connected or coupled to a common inductor 708. Note that for the embodiment, seven negatively coupled inductor pairs may be coupled to Loads A-H and common inductor 708 to reduce a cross-coupling noise between eight loads.

Figure 8:
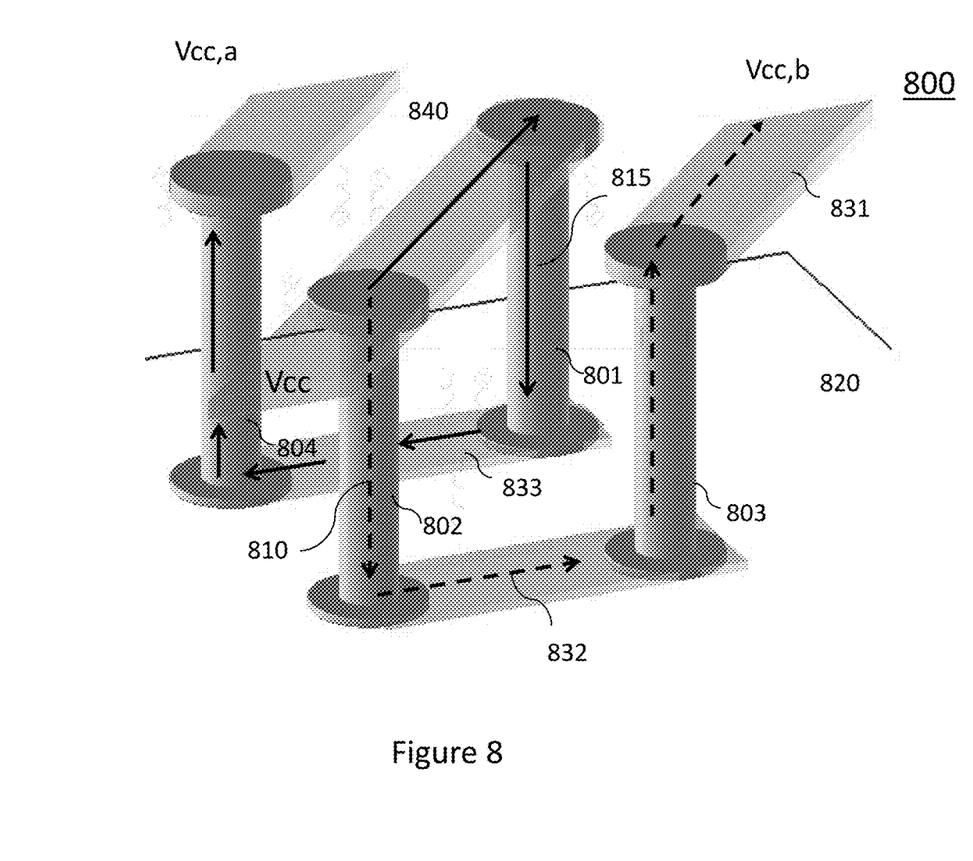
FIG. 8 illustrates an example of passive structures associated with the example circuits of FIGS. 1-7 in accordance with various embodiments.

FIG. 8 illustrates an example of passive structures associated with the example circuits of FIGS. 1-7 in accordance with various embodiments. In the embodiment, FIG. 8 illustrates a portion of a package substrate or printed circuit board 800 having traces indicated by shadowed paths 831 on a lower layer 820 and an upper layer 840 connected by microvias or plated through holes (PTHs) or Laser Through Holes (LTHs) 801, 802, 803, and 804. Accordingly, in embodiments, a first current path 810 and a second current path 815 may flow along microvia and trace pathways to form opposing loops, thus creating a negative inductance. In the embodiment, as indicated by a dotted black arrow, a first current path 810 starting near a top of microvia 802 may flow down along microvia 802 to lower layer 820, continuing laterally to the right along a trace 832 to microvia 803 and up to upper layer 840 to continue to Load B. In the embodiment, in a similar manner, a second current path 815, indicated by a solid arrow, may flow along a trace on upper layer 840, down microvia 801, along trace 833, and may be directed up microvia 804 towards Load A. Accordingly, in embodiments, first current path 810 and second current path 815 may form opposing loops, thus creating a negative inductance that may form a portion of one or more negatively coupled inductive pairs in the various example circuits above.

Figure 9:
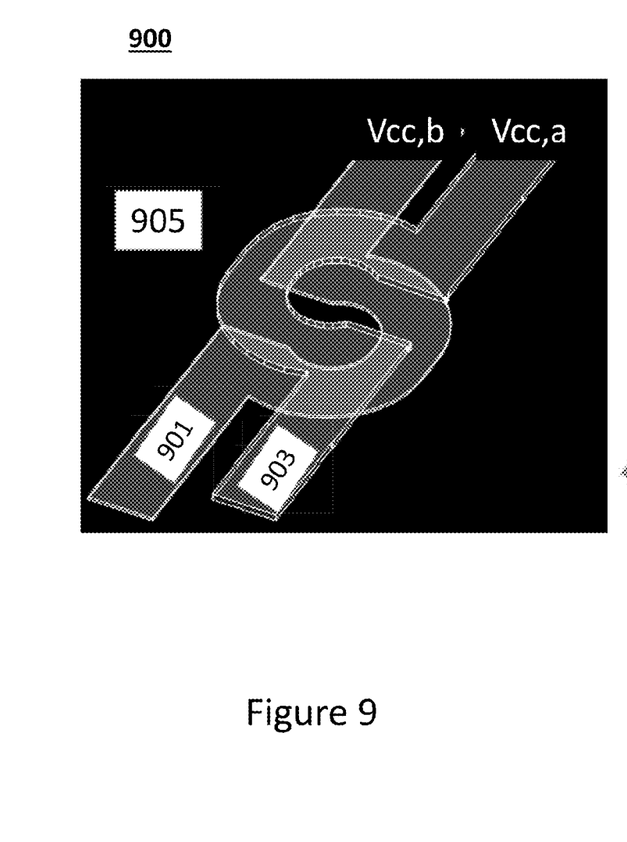
FIGS. 9 and 10 illustrate additional examples of passive structures in accordance with various embodiments.
Figure 10:
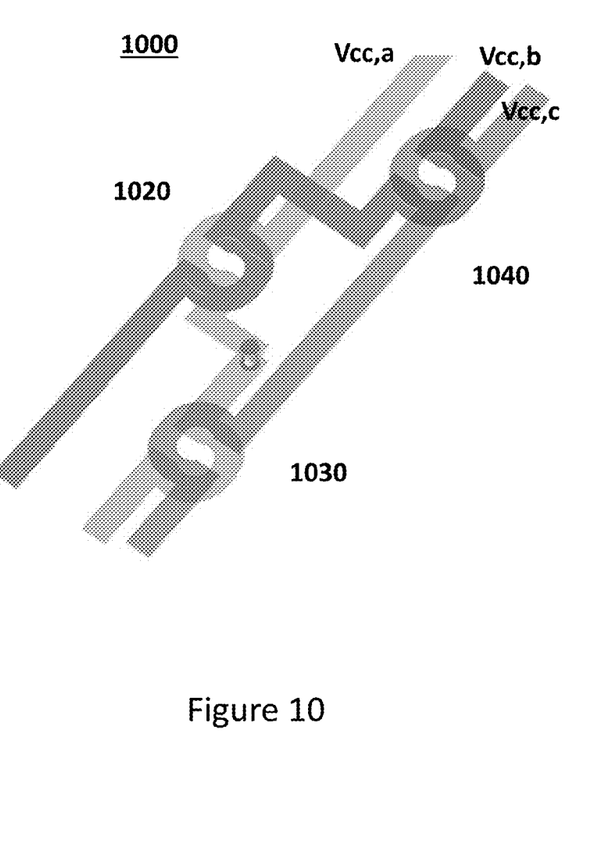

FIGS. 9 and 10 illustrate additional example structures associated with the embodiments of FIGS. 1-8. In the embodiment, example structure 900 of FIG. 9 may form a portion of an example printed circuit board or package substrate. In the embodiment shown, structure 900 may include a trace that forms a path 901 along which a current may be directed in a counter clock-wise direction in a partially or substantially complete circle as it flows toward a Load B. Likewise, for the embodiment, a path 903 may direct a current in a partially or substantially complete circle but in a clock-wise direction as it flows toward a Load A. Thus, in embodiments, a direction of a first current along path 901 may oppose a direction of a second current along path 903. Accordingly, magnetic fields produced by the first and second current may also be opposing which may in embodiments create a negatively coupled inductor pair 905. Furthermore, in embodiments, path 903 may be on an upper layer while path 901 may be on a lower layer. Next, FIG. 10 illustrates a portion of a printed circuit board or substrate 1000 including one or more negatively coupled inductor pairs similar to negatively coupled pair 905. In the embodiment of FIG. 10, first, second, and third negatively coupled inductor pairs may be arranged as circular coils among two circuit board layers. In embodiments, a first negatively coupled inductor pair 1020, a second negatively coupled inductor pair 1030, and a third negatively coupled inductor pair 1040 may, in particular, correspond to one or more negatively coupled inductor pairs as described in FIG. 2.

Figure 11:
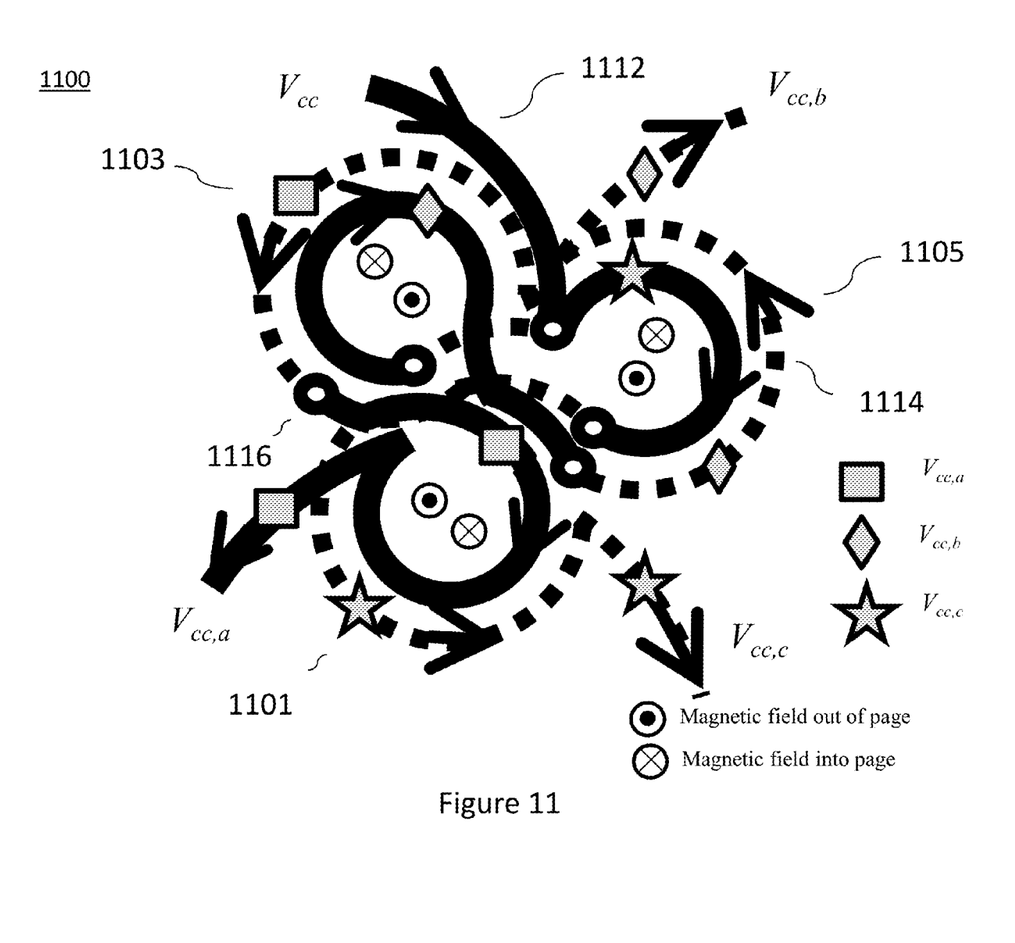
FIG. 11 illustrates an example of passive structures associated with the embodiment of FIG. 2.

FIG. 11 illustrates an additional embodiment associated with the embodiments of FIGS. 1-7, in particular, FIG. 2. In structure 1100, a first negatively coupled inductor pair 1101, a second negatively coupled inductor pair 1103, and a third negatively coupled inductor pair 1105 may be arranged on a substrate or in a printed circuit board in a clover configuration. In the embodiment shown, a first and the second layer of the substrate may be connected or coupled by one or more microvias, PTHs, or LTHs 1116. As shown in the embodiment, a solid line indicates an upper path 1112 along a first or upper layer while a dotted line indicates a lower path 1114 along a second or lower layer, eventually leading to one or more of a Load A, B, or C. In embodiments, structure 1100 may include three negatively coupled pairs arranged in a manner such that substantially all of the magnetic field or magnetic flux path associated with negatively coupled inductor pairs 1101, 1103, and 1105 may be included or contained in the clover configuration of structure 1100. Thus, in embodiments, unintended coupling with outside circuits may not occur.

Figure 12:
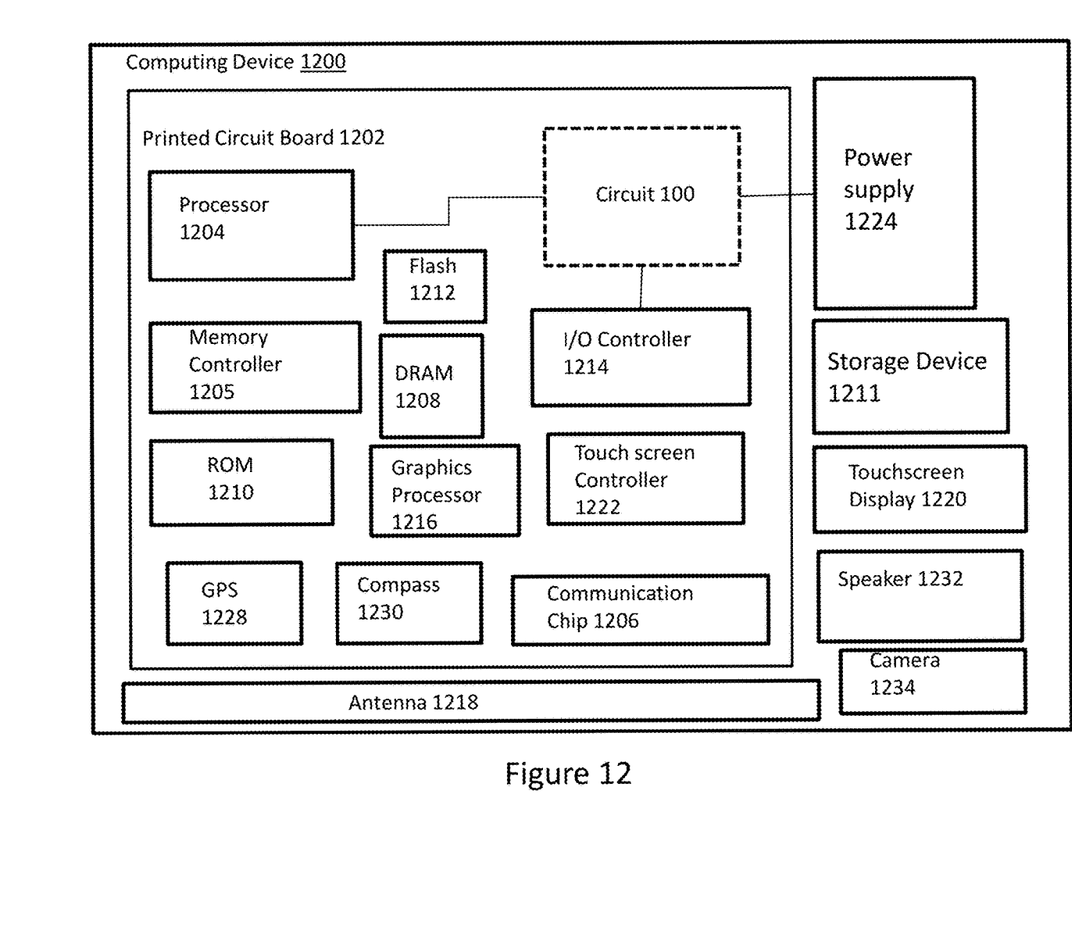
FIG. 12 illustrates an example system configured to employ the apparatuses and methods described herein, in accordance with various embodiments.

FIG. 12 illustrates an example system or computing device 1200 that may employ the apparatuses and/or methods described herein (e.g., circuit 100 and associated embodiments as shown in FIGS. 2-11), in accordance with various embodiments. As shown, computing device 1200 may include a number of components, such as one or more processor(s) 1204 (one shown) and at least one communication chip 1206. In various embodiments, the one or more processor(s) 1204 each may include one or more processor cores. In various embodiments, at least one communication chip 1206 may be physically and electrically connected or coupled to the one or more processor(s) 1204. In further implementations, the communication chip 1206 may be part of the one or more processor(s) 1204. In various embodiments, computing device 1200 may include printed circuit board (PCB) 1202. For these embodiments, the one or more processor(s) 1204 and communication chip 1206 may be disposed thereon. In alternate embodiments, the various components may be connected or coupled without the employment of PCB 1202.

Depending on its applications, computing device 1200 may include other components that may or may not be physically and electrically connected or coupled to the PCB 1202. These other components include, but are not limited to, memory controller 1205, volatile memory (e.g., dynamic random access memory (DRAM) 1208), non-volatile memory such as read only memory (ROM) 1210, flash memory 1212, storage device 1211 (e.g., a hard-disk drive (HDD)), an I/O controller 1214, a digital signal processor (not shown), a crypto processor (not shown), a graphics processor 1216, one or more antenna 1218, a display (not shown), a touch screen display 1220, a touch screen controller 1222, a battery as part of power supply 1224, an audio codec (not shown), a video codec (not shown), a global positioning system (GPS) device 1228, a compass 1230, an accelerometer (not shown), a gyroscope (not shown), a speaker 1232, a camera 1234, and a mass storage device (such as hard disk drive, a solid state drive, compact disk (CD), digital versatile disk (DVD)) (not shown), and so forth. In various embodiments, the processor 1204 may be integrated on the same die with other components to form a System on Chip (SoC).

In some embodiments, the one or more processor(s) 1204, flash memory 1212, and/or storage device 1211 may include associated firmware (not shown) storing programming instructions configured to enable computing device 1200, in response to execution of the programming instructions by one or more processor(s) 1204, to practice all or selected aspects of the methods described herein. In various embodiments, these aspects may additionally or alternatively be implemented using hardware separate from the one or more processor(s) 1204, flash memory 1212, or storage device 1211.

In various embodiments, one or more components of computing device 1200 may include circuit 100 and associated embodiments. For example, as shown, circuit 100 may be coupled to power supply 1224 and a first and a second load, e.g., processor 1204 and I/O Controller 1214. In other embodiments, circuit 100 or other associated embodiments as described above may be coupled to a plurality of loads that are described herein and shown as example blocks on printed circuit board 1202 and/or outside of printed circuit board 1202. Circuit 100 or other associated embodiments may be located in or on printed circuit board 1202 or at other locations within computing device 1200.

The communication chip 1206 may enable wired and/or wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth, and a second communication chip 1206 may be dedicated to longer range wireless communications such as GPS, EDGE, GPRS, CDMA, WiMAX, LTE, Ev-DO, and others.

In various implementations, the computing device 1200 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 1200 may be any other electronic device that processes data.

Some non-limiting Examples are provided below.

Example 1 may be a circuit comprising a first inductor; and a negatively coupled inductor pair coupled between the first inductor and a first load and a second load, wherein the negatively coupled inductor pair may include a second inductor and a third inductor, wherein the second inductor is coupled to the first load and the third inductor may be coupled to the second load to reduce a cross-coupling noise between the first load and the second load.

Example 2 may be the circuit of Example 1, wherein to reduce the cross-coupling noise between the first load and the second load, the negatively coupled inductor pair is to counteract a voltage change across the first inductor.

Example 3 may be the circuit of Example 1 wherein the first inductor may be coupled between a power supply and the negatively coupled inductor pair.

Example 4 may be the circuit of Example 1, wherein the first inductor may have an inductance value that approximately equals an inductance value of the negatively coupled inductor pair, to substantially cancel the cross-coupling noise between the first load and the second load.

Example 5 may be the circuit of Example 1 wherein the negatively coupled inductor pair and the first inductor may have a reduced inductance value to reduce a self-noise of the first load or the second load.

Example 6 may be the circuit of Example 1 wherein the cross-coupling noise between the first load and the second load may be generated in response to a current change in the first load or the second load.

Example 7 may be the circuit of Example 1, wherein the cross-coupling noise between the first and the second load may be generated in response to a simultaneous change in current at the first and the second load.

Example 8 may be the circuit of Example 1, wherein the first load and the second load may share a single power supply.

Example 9 may be the circuit of Example 1 wherein the negatively coupled inductor pair may include a first negatively coupled inductor pair, the apparatus further comprising a second negatively coupled inductor pair that may be coupled between the second inductor and the first load.

Example 10 may be the circuit of Example 9 wherein the second negatively coupled inductor pair may be coupled to a third load, wherein the first and the second negatively coupled inductor pairs may be configured to reduce a cross-coupling noise between the first, second, and third loads.

Example 11 may be a method comprising sending a current to a first load and a second load through a negatively coupled inductor pair; and creating a negative mutual inductance to reduce a voltage noise produced across an inductance common to the first load and the second load in response to a change in the current sent to the first load and the second load.

Example 12 may be the method of Example 11 wherein sending the current to a first load and a second load may include sending the current through a negatively coupled inductor pair coupled to a single power supply.

Example 13 may be the method of Example 11 wherein creating the negative mutual inductance in response to the change in the current sent to the first load and the second load may include creating a negative mutual inductance induced voltage in response to a simultaneous change in current provided to the first load and to the second load.

Example 14 may be the method of Example 11 wherein the creating the negative mutual inductance to reduce the voltage noise may include reducing a self-noise at the first load or the second load.

Example 15 may be an apparatus comprising a circuit that may include—: a first inductor; and a first negatively coupled inductor pair and a second negatively coupled inductor pair that may be coupled between the first inductor and respective first and second loads to reduce a cross-coupling noise between the first and the second loads.

Example 16 may be the apparatus of Example 15, further comprising a third negatively coupled inductor pair coupled between the first inductor and a respective third load.

Example 17 may be the apparatus of Example 15 wherein a number of loads in a plurality of loads including the first and second loads may be equal to n, wherein n is an integer greater than 1.

Example 18 may be the apparatus of Example 17 wherein for n loads, $n*(n-1)/2$ negatively coupled inductor pairs may be coupled to the first inductor to reduce a cross-coupling noise between the n loads.

Example 19 may be a system, comprising: a first load component; a second load component; a third load component; and a circuit that may be coupled to the first, second, and third load components, wherein the circuit may include a first inductor; and a first, second, and third negatively coupled inductor pairs coupled on a first side to the first inductor and on a second side to the respective first, second, and third load components to reduce a cross-coupling noise between the first, second, and third load components.

Example 20 may be the system of Example 19 wherein the first, second, and third negatively coupled inductor pairs may be arranged in a printed circuit board in a clover configuration.

Example 21 may be the system of Example 19 wherein the first, second, and third negatively coupled inductor pairs may be arranged as circular coils among two circuit board layers.

Example 22 may be the system of Example 21 wherein to reduce the cross-coupling noise between the first, second, and third load components, the first, second, and third negatively coupled inductor pairs may be configured to counteract a voltage change across the first inductor.

Example 23 may be an apparatus, comprising a circuit that may include: a first plurality of negatively coupled inductor pairs; a second plurality of negatively coupled inductor pairs; and a negatively coupled inductor pair that may include a first inductor and a second inductor, wherein the first inductor may be coupled to the first plurality of negatively coupled inductor pairs and the second inductor may be coupled to the second plurality of negatively coupled inductor pairs to reduce a cross-coupling noise between a plurality of loads coupled to the first plurality of negatively coupled inductor pairs and the second plurality of negatively coupled inductor pairs.

Example 24 may be the apparatus of Example 23 further comprising a second inductor that may be coupled to the first inductor and the second inductor of the negatively coupled inductor pair.

Example 25 may be the apparatus of Example 24 wherein the second inductor may be coupled between a voltage regulator and the negatively coupled inductor pair.

Example 26 may be a method comprising sending a current to a first load, a second load, and a third load, through a respective first negatively coupled inductor pair, second negatively coupled inductor pair, and third negatively coupled inductor pair; and creating a negative mutual inductance using the first negatively coupled inductor pair, second negatively coupled inductor pair, and third negatively coupled inductor pair to reduce a voltage noise produced across an inductance common to the first load, the second load, and the third load, in response to a change in the current sent to the first load, the second load, or the third load.

Example 27 may be the method of Example 26 wherein sending the current to the first load, second load, and the third load may include sending the current through a common inductor coupled to a single power supply.

Example 28 may be the method of Example 26 wherein creating the negative mutual inductance in response to the change in the current sent to the first load, the second load, and the third load may include creating the negative mutual inductance in response to a simultaneous change in current provided to the first load, the second load, and the third load.

Example 29 may be a method comprising sending a current to a first plurality of loads coupled to a first plurality of negatively coupled inductor pairs and to a second plurality of loads coupled to a second plurality of negatively coupled inductor pairs; and creating a negative mutual inductance to reduce a voltage noise produced across an inductance common to the first plurality of loads and the second plurality of loads to reduce a cross-coupling noise among one or more loads of the first plurality of loads or the second plurality of loads.

Example 30 may be the method of Example 29 wherein sending the current to the first plurality of loads and to the second plurality of loads may include sending the current through a negatively coupled inductor pair including a first inductor and a second inductor, wherein the first inductor may be coupled to the first plurality of negatively coupled inductor pairs and the second inductor may be coupled to the second plurality of negatively coupled inductor pairs.

Example 31 may be the method of Example 29 wherein sending the current to the first plurality of loads and to the second plurality of loads may include sending the current through a common inductor coupled to a single power supply.

Example 32 may be the method of Example 29 wherein creating the negative mutual inductance to reduce the voltage noise may include creating the negative mutual inductance in response to a change in current sent to one or more loads in the first plurality of loads or the second plurality of loads.

Although certain embodiments have been illustrated and described herein for purposes of description this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. An apparatus, comprising:
    a circuit that includes:
        a first load;
        a second load;
        a first inductor; and
        a negatively coupled inductor pair coupled between the first inductor and the first load and the second load, wherein the negatively coupled inductor pair includes a second inductor and a third inductor, wherein the second inductor is coupled to the first load and the third inductor is coupled to the second load to reduce a cross-coupling noise between the first load and the second load, wherein the cross-coupling noise is caused by a current drawn by one or both of the first load and the second load, wherein the current is to change during use of one or both of the first load or the second load, and wherein the first inductor is coupled between a power supply and the negatively coupled inductor pair.

2. The apparatus of claim 1, wherein the first inductor has an inductance value that approximately equals an inductance value of the negatively coupled inductor pair, to substantially cancel the cross-coupling noise between the first load and the second load.

3. The apparatus of claim 1, wherein the negatively coupled inductor pair and the first inductor have a reduced inductance value to reduce a self-noise of the first load or the second load.

4. The apparatus of claim 1, wherein the first load and the second load share a single power supply.

5. The apparatus of claim 1, wherein the negatively coupled inductor pair includes a first negatively coupled inductor pair, and the apparatus further comprises a second negatively coupled inductor pair coupled between the second inductor and the first load.

6. The apparatus of claim 5, wherein the second negatively coupled inductor pair is coupled to a third load, wherein the first and the second negatively coupled inductor pairs are configured to reduce a cross-coupling noise between the first, second, and third loads.

7. A method, comprising:
    sending a current to a first load and a second load from a power supply through an inductor and a negatively coupled inductor pair; and
    creating a negative mutual inductance to reduce a voltage noise produced across an inductance common to the first load and the second load in response to a change in the current drawn by one or both of the first load and the second load, wherein the change in the current is to occur during use of one or both of the first load or the second load.

8. The method of claim 7, wherein sending the current to the first load and the second load includes sending the current through a negatively coupled inductor pair coupled to a single power supply.

9. The method of claim 7, wherein sending the current to the first load and the second load includes sending the current through an inductor having an inductance value that approximately equals an inductance value of the negatively coupled inductor pair.

10. The method of claim 9, wherein sending the current to the first load and the second load includes sending the current through the negatively coupled inductor pair to reduce a self-noise of the first load or the second load.

* * * * *